(12) United States Patent
Smith

(10) Patent No.: US 7,153,399 B2
(45) Date of Patent: Dec. 26, 2006

(54) METHOD AND APPARATUS FOR PRODUCING UNIFORM ISOTROPIC STRESSES IN A SPUTTERED FILM

(75) Inventor: Donald Leonard Smith, Bolinas, CA (US)

(73) Assignee: NanoNexus, Inc., Fremont, CA (US)

( * ) Notice: Subject to any disclaimer, the term of this patent is extended or adjusted under 35 U.S.C. 154(b) by 359 days.

(21) Appl. No.: 10/487,652

(22) PCT Filed: Aug. 23, 2002

(86) PCT No.: PCT/US02/26785

§ 371 (c)(1),
(2), (4) Date: Feb. 19, 2004

(87) PCT Pub. No.: WO03/018865

PCT Pub. Date: Mar. 6, 2003

(65) Prior Publication Data

US 2005/0003196 A1    Jan. 6, 2005

Related U.S. Application Data

(60) Provisional application No. 60/314,776, filed on Aug. 24, 2001.

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |

(52) U.S. Cl. ............................ 204/192.12; 204/192.1; 204/192.13; 204/298.02; 204/298.12; 204/298.23; 204/298.26; 204/298.27

(58) Field of Classification Search ............. 204/192.1, 204/192.12, 192.13, 298.01, 298.02, 298.12, 204/298.16, 298.23, 298.2, 298.26, 298.27
See application file for complete search history.

(56) References Cited

U.S. PATENT DOCUMENTS

| | | | | |
|---|---|---|---|---|
| 3,856,647 | A | * 12/1974 | Blachman | ............... 204/192.17 |
| 4,834,855 | A | 5/1989 | Bloomquist | |
| 5,154,810 | A | * 10/1992 | Kamerling et al. | ..... 204/192.13 |
| 5,240,583 | A | 8/1993 | Ahonen | |
| 5,656,138 | A | 8/1997 | Scobey et al. | |
| 5,798,027 | A | 8/1998 | Lefebvre et al. | |
| 5,830,327 | A | * 11/1998 | Kolenkow | ............. 204/192.12 |
| 5,993,616 | A | 11/1999 | Suwabe et al. | |
| 6,218,033 | B1 | * 4/2001 | Cao et al. | ................. 428/832.2 |
| 6,425,988 | B1 | 7/2002 | Montcalm et al. | |
| 6,497,799 | B1 | * 12/2002 | McLeod | ................... 204/192.2 |

FOREIGN PATENT DOCUMENTS

| | | |
|---|---|---|
| JP | 1995-292471 | 5/1997 |
| JP | 2001-020067 | 8/2002 |

* cited by examiner

*Primary Examiner*—Nam Nguyen
*Assistant Examiner*—Luan V. Van
(74) *Attorney, Agent, or Firm*—Michael A. Glenn; Glenn Patent Group

(57) ABSTRACT

The invention provides a method and apparatus for producing uniform, isotropic stresses in a sputtered film. In the presently preferred embodiment, a new sputtering geometry and a new domain of transport speed are presented, which together allow the achievement of the maximum stress that the film material can hold while avoiding X-Y stress anisotropy and avoiding stress non-uniformity across the substrate.

18 Claims, 3 Drawing Sheets

METHOD AND APPARATUS FOR PRODUCING UNIFORM ISOTROPIC STRESSES IN A SPUTTERED FILM

RELATED APPLICATION

This application claims benefit to U.S. Provisional Patent Application 60/314,776 filed Aug. 24, 2001.

BACKGROUND OF THE INVENTION

1. Technical Field

The invention relates to the deposition of films on substrates. More particularly, the invention relates to a method and apparatus for producing uniform, isotropic stresses in a sputtered film.

2. Description of the Prior Art

Thin films are often deposited on substrates by sputtering in a glow-discharge plasma, where ions accelerated out of the plasma knock atoms off of the target (source) material whence the atoms are transported to the substrate. A magnetically confined plasma generator (magnetron) is typically used to increase sputtering efficiency and to reduce the minimum operating pressure. Sputtering is a preferred deposition technique because it can be used for any material, because the energy of the depositing atoms helps film adherence, and because the substrates do not get very hot.

Uniformity of film thickness across large substrates is usually important, and one of two approaches is conventionally taken to achieve such uniformity.

One such approach is to position the substrates at a radius far from the target relative to substrate and target diameters. To increase throughput and use targets efficiently, many substrates are positioned at this radius over most of a hemisphere and are kept in a planetary (two-axis) motion so that they occupy a wide range of positions over the hemisphere during the course of the deposition time. This averages out deposition rate variation over the hemisphere.

The second approach uses a rectangular target that is larger than the substrate in the target's long dimension. The substrate is placed close to the target and is passed back and forth across it in linear transport so that the substrate is painted with a uniform swath of film in successive layers much like painting with a roller. Typically 100 nm of film are deposited in each pass.

Sputtering is used in the formation of various microelectronic structures. Among these structures is a patterned spring structure that is useful in such applications as device testing. For example, D. Smith and S. Alimonda, Photolithographically Patterned Spring Contact, U.S. Pat. No. 5,613,861 (25 Mar. 1997), U.S. Pat. No. 5,848,685 (15 Dec. 1998), and International Patent Application No. PCT/US 96/08018 (Filed 30 May 1996), disclose a photolithography patterned spring contact, which is "formed on a substrate and electrically connects contact pads on two devices. The spring contact also compensates for thermal and mechanical variations and other environmental factors. An inherent stress gradient in the spring contact causes a free portion of the spring to bend up and away from the substrate. An anchor portion remains fixed to the substrate and is electrically connected to a first contact pad on the substrate. The spring contact is made of an elastic material and the free portion compliantly contacts a second contact pad, thereby contacting the two contact pads."

Such patterned spring technology depends on being able to control very high levels of film mechanical stress uniformly across a substrate. Stress is common in thin films and is usually undesirable. Indeed, many techniques of process control are used in planetary and linear-transport sputtering, as well as in other film-deposition processes, to minimize stress. Consequently, while many of the factors influencing stress are recognized, the state of the art is concerned with substantially eliminating such stresses.

Ion bombardment is known to increase compressive stress in any vacuum-deposition process. In magnetron sputtering, low plasma pressure increases compression, higher pressure creates tensile stress, and still higher pressure results in porous films that have no mechanical strength in the film plane. The magnetron sputter-deposition of films imparted with stress gradients by increasing plasma pressure during deposition is a presently preferred technique for implementing patterned spring technology.

Although it is known in the art how to minimize stress and how to produce high compressive or tensile stress, techniques for maximizing stress and of controlling uniform high stress across large substrates are not known. Both maximizing the stress level and making it uniform are desirable in connection with the fabrication of patterned spring structures. It would be advantageous to provide a method and apparatus for producing uniform, isotropic stresses in a sputtered film.

SUMMARY OF THE INVENTION

The invention provides a method and apparatus for producing uniform, isotropic stresses in a sputtered film. In the presently preferred embodiment, a new sputtering geometry and a new domain of transport speed are presented, which together allow the achievement of the maximum stress that the film material can hold while avoiding X-Y stress anisotropy and avoiding stress non-uniformity across the substrate, where the X-Y refers to two orthogonal dimensions in the plane of the substrate, The presently preferred embodiment of the invention comprises a method and apparatus for depositing a film on a substrate that comprises the steps of depositing successive layers of film on said substrate at any of successive different discrete deposition angles of rotation of said substrate and/or of said deposition source about a normal axis of said substrate; providing a substantially identical amount of deposition from each different deposition angle as for each other deposition angle; wherein said overall deposited film behaves substantially isotropically in properties in all directions parallel to said substrate and at different angles of rotation about said normal axis.

The herein disclosed method and apparatus further comprise the step of reducing the thickness of successive layers of said film on the order of a property projection distance within a depositing material; wherein said property projection distance comprises a distance at which a fluctuation in a relevant film property from point to point through said film's thickness becomes too small to affect overall properties of said film when averaged through said film's thickness; and wherein said fluctuation is caused by layering.

In a preferred embodiment, said property projection distance is within a minimum of one atomic diameter of said depositing material to a maximum of ten atomic diameters for stress and strain, and a maximum of one magnetic domain diameter for magnetic properties.

The herein disclosed method and apparatus further comprise moving each substrate past a same one or more sources of depositing material in a planetary manner; wherein each time said substrate passes by one of said sources of depositing material as said substrate executes a planet orbit, said substrate has been rotated about said substrate's normal axis with respect to said depositing material source by which it is passing.

In a preferred embodiment said substrate is rotated 360/n degrees each time it passes by one of n said depositing material sources, wherein n is an integer larger than 2, or by 90 degrees if n is 2.

The herein disclosed method and apparatus further comprise providing four depositing material sources arranged about a circle; and positioning a relevant anisotropic property of each said depositing material source 90 degrees with respect to that of a previous depositing material source; wherein each substrate maintains a fixed rotational orientation about its normal axis as said substrate orbits, as measured from a stationary point; wherein said film is deposited in layers having an anisotropy rotated 90 degrees for each successive layer.

In a preferred embodiment said source of depositing material exhibits two-fold symmetry in a relevant anisotropic property of said depositing material source.

In a preferred embodiment a 270 degree rotation of said substrate is equivalent to a 90 degree rotation of said substrate with respect to said anisotropy in said relevant property of said film layer when the said source exhibits two-fold symmetry.

The herein disclosed method and apparatus further comprise providing two depositing material sources; wherein each depositing material source has two-fold symmetry; wherein said depositing material sources are disposed relative to one another such that a relevant anisotropic property of said depositing material source is rotated 90 degrees with respect to a previous depositing material source; wherein each substrate maintains a fixed rotational orientation about its normal axis as it orbits, as measured from a stationary point; and wherein said film is deposited in layers having an anisotropy rotated 90 degrees for each successive layer.

In a preferred embodiment said sources of depositing material comprise linear magnetron sputtering targets from which said depositing material emanates in a pattern which approximates a rectangle having rounded corners.

In a preferred embodiment a distance along a substrate normal axis and between a substrate surface and a target surface from which depositing material emanates is sufficiently smaller than a distance between material as it emanates from an end of said rectangular emanation pattern and a nearest edge of said substrate such that a relevant property of said film is sufficiently uniform along said substrate from a center of said substrate to said substrate's edge.

The herein disclosed method and apparatus further comprise making film stress along directions parallel to said substrate sufficiently uniform across said substrate by making a distance along a substrate normal axis and between a substrate surface and a target surface from which depositing material emanates sufficiently small, as compared to a distance between material as it emanates from an end of said rectangular emanation pattern and the nearest edge of the substrate.

In a preferred embodiment a ratio of distance along a substrate normal axis and between a substrate surface and a target surface from which depositing material emanates to a distance between material as it emanates from an end of said rectangular emanation pattern and a nearest edge of said substrate is ¼ or less.

A further embodiment of the herein disclosed method and apparatus further comprise symmetrically disposing at least one deposition source at any of successive different deposition angles of rotation of said substrate and of said deposition source about a normal axis of said substrate; and depositing successive layers of film on said substrate to achieve high levels of stress in said films, wherein said stress is both isotropic in a film plane and uniform over large areas of a substrate surface.

The herein disclosed method and apparatus further comprise providing a monatomic-layer-scale deposition thickness per pass over a target using close-spaced magnetron sputtering from long, substantially rectangular targets; wherein effects on film stress caused by periodic fluctuations in any of deposition incident angle, ion bombardment flux, and substrate azimuthal orientation are minimized.

The herein disclosed method and apparatus further comprise rotating said substrate by substantially 90 degrees relative to the source over which it is passing between successive passes to laminate said film; wherein X-Y anisotropy in a film plane is eliminated.

The herein disclosed method and apparatus further comprise using magnetron targets that are longer, when compared to a substrate diameter, than is needed for uniform film thickness; wherein uniform film stress along a long axis of said target is achieved.

The herein disclosed method and apparatus further comprise providing a drive mechanism comprising a peripheral chain arranged around a ring of substrates, and a chain extending from one substrate to a fixed central sprocket, to impart high speed, planetary motion to said substrate.

DETAILED DESCRIPTION OF THE INVENTION

Figure 1:
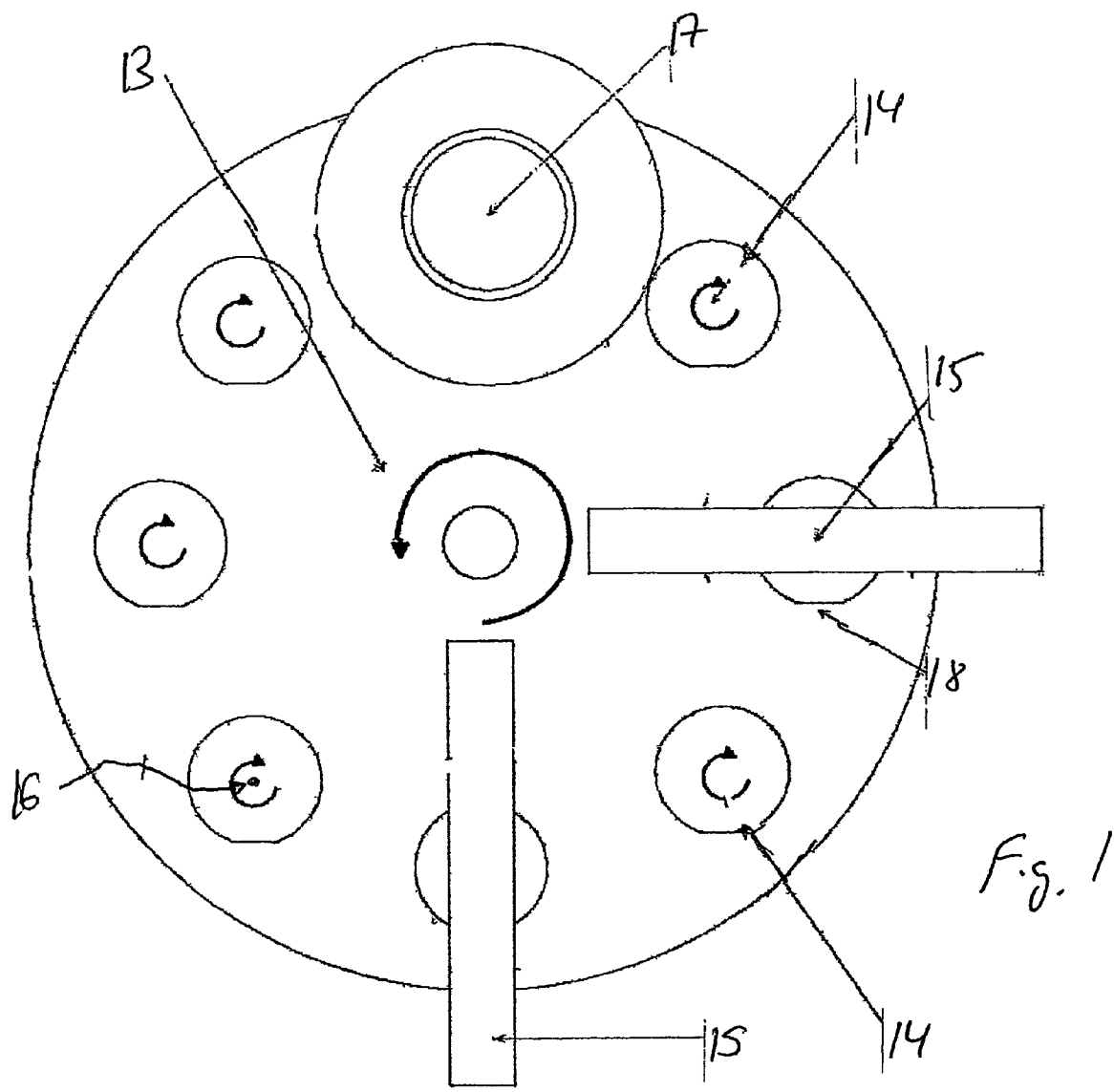
FIG. 1 is a schematic diagram that shows a plan view of a planetary system and placement of targets and an ion gun according to the invention.

A new sputtering geometry and a new domain of transport speed are herein presented, which together allow the achievement of the maximum stress that the film material can hold, while avoiding X-Y stress anisotropy and avoiding stress non-uniformity across the substrate and stress oscillations through the thickness of the film.

The invention is based in part upon the recognition that the angle of incidence at which atoms are deposited on a substrate is an important determinant of film stress, with more grazing (off-normal) angles resulting in more tension or, if excessive, in porosity. In planetary substrate motion, different points on a substrate in radius from the planet's axis, and different azimuthal angles at a given point, necessarily experience different time sequences of deposition angle and therefore different film stresses. For purposes of the discussion herein, the azimuthal angle is that rotating in the film lane XY, from +X to +Y to −X to −Y; and film stress is always biaxial, i.e. existing long both X and Y. Film stress may be anisotropic, i.e. different in X vs. Y at a given point, and it may be nonuniform in either X or Y across the substrate, or through the thickness of the film.

In linear transport, the azimuthal direction that is parallel to the substrate's transport experiences a different sequence of deposition angles over a pass than the perpendicular direction. Moreover, in linear transport, a single pass typically deposits 100 nm or about 300 monatomic layers (monolayers) of film. During this pass the incident angle varies from that of grazing upon the substrate's approach to the target to substantially perpendicular when the substrate is directly in front of the target to grazing again upon the substrate's exit. Thus, a layering of alternating stress levels results that prevents the attainment of maximum stress.

In the herein disclosed geometry (see FIG. 1), substrates 14 that are arrayed in a ring on a rotation plate 13, rotate about their own axes relative to the plate, while the ring of substrates and the plate simultaneously rotate about the plate's axis at substantially the same angular velocity but with opposite sign relative to a fixed point, such that the substrates do not rotate relative to a fixed point. The substrates pass closely 19 (see FIG. 2) over and centered on each of one or more rectangular targets 15. Each target is oriented with its long axis along a plate radius and with its length being sufficiently longer than the substrate 14 so that the decrease in grazing-incidence deposit due to proximity 10 to the end of the target does not result in a stress nonuniformity along that direction. This length of the target is typically greater than that which is needed to achieve uniformity in film thickness.

A particularly efficient embodiment uses two targets oriented at right angles to each other so that the substrate 14 executes two target 15 passes during each plate 13 rotation, with each pass having the substrate's 14 X and Y directions reversed relative to the pass direction. This laminates the film to average out the X-Y anisotropy that is inherent to conventional linear transport. Substrate rotation at substantially the same angular velocity but opposite sign, relative to the plate, as plate rotation about a fixed point also results in film thickness uniformity because the point on the inner edge of the substrate 14, towards the center of the plate, traverses the target 15 at the same linear velocity as the outer point and thus accumulates deposit for the same length of time per pass.

FIG. 1 shows the rotation plate 13 with the ring of substrates 14 simultaneously rotating around their own axes 16. FIG. 1 also shows the potential placement of two rectangular targets 15 at right angles to each other to double the number of target passes by each wafer 14 per plate 13 rotation. The desired orientation 18 of a wafer 14 as it passes under the rectangular target 15 is also shown in FIG. 1. For this example, the wafer rotates 90 degrees to have the identical orientation 18 under each target, relative to a fixed point. Those skilled in the art will appreciate that other arrangements may be provided in connection with the invention. For example, four targets may be provided, oriented at 90 degrees to a next target, in a circle above the plate.

Figure 2:
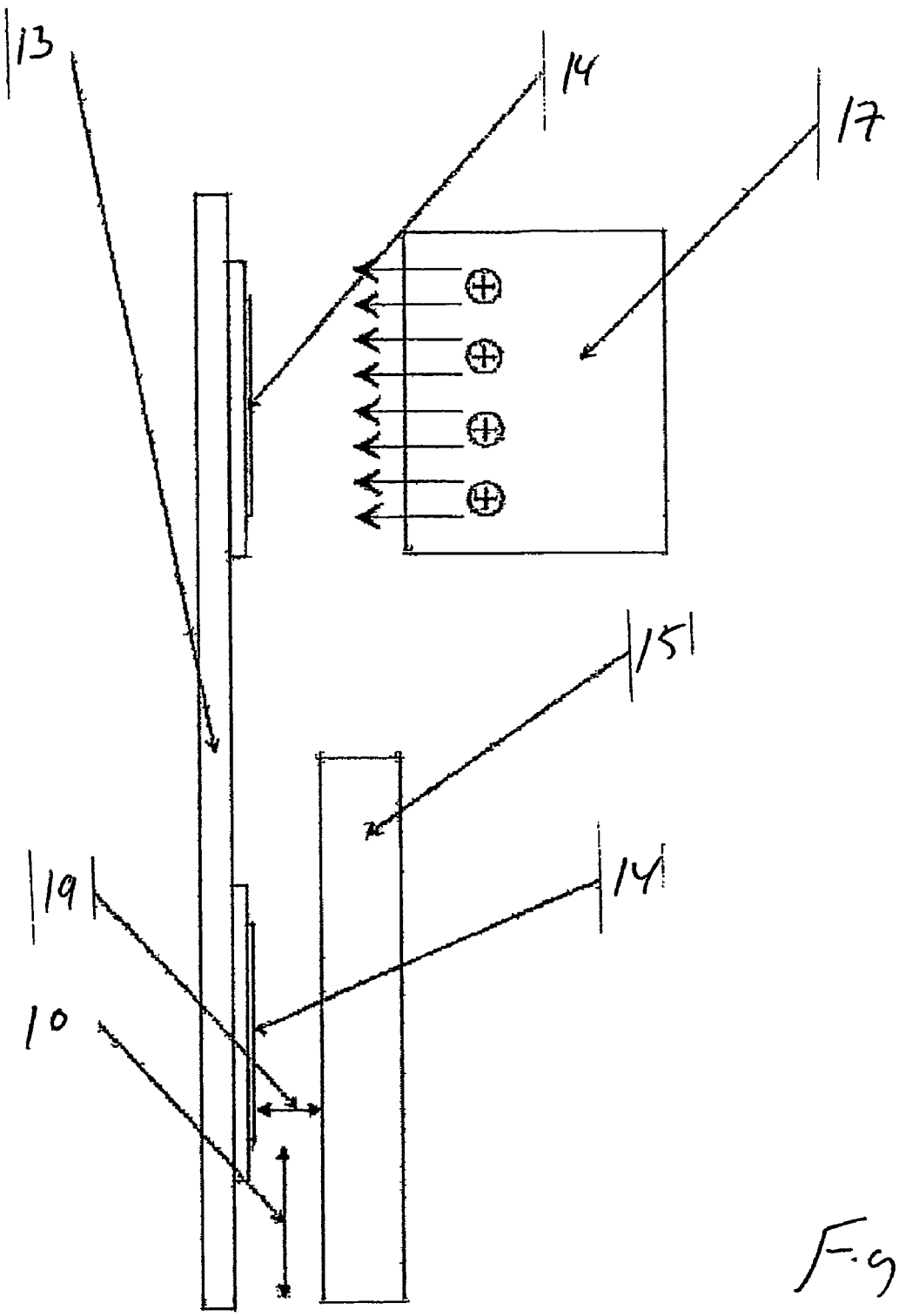
FIG. 2 is a schematic diagram that shows a side view of the planetary system shown in FIG. 1, and which illustrates the proximity and relative size of the substrates to the targets and the ion gun according to the invention.

An ion source 17 can be situated at a point around the plate 13 to bombard the film once per pass and thereby impart compressive stress where needed. FIGS. 1 and 2 show one location of the ion source 17. Alternatively, the substrates 14 could be electrically biased with DC power if conductive, or RF power if insulating, to accelerate the bombarding ions out of the plasma generated by the sputter source, without the use of an ion gun. However, RF bias is difficult to deliver and contain when substrates are in motion.

Over the course of a single rotation of the plate 13, each substrate 14 experiences periodic variation in several process parameters that affect stress, e.g. deposition angle of incidence, azimuthal orientation to the target's long axis, and ion bombardment flux. Because an objective of the invention is to have these variations not result in a periodic layering of film stress, the period of this variation in terms of equivalent film thickness should be of the order of a few atomic spacings, so that the developing atomic structure does not exhibit a variation. At the same time, as a practical matter, it is desired to deposit film at as high a rate as possible, both to increase production throughput and to minimize the deleterious effect of co-depositing impurities from the background gasses in the vacuum chamber. Consequently, it is desired to rotate the plate at a much higher speed than would otherwise be necessary. For example, at a typically desired time-averaged deposition rate of 1 nm/sec (3.6 um/hr or about 3 monolayers/sec), the plate should preferably rotate at 1 to 3 rps or 60–180 rpm. This is about 10× faster than is needed or desired in conventional planetary deposition, and about 100× faster than the pass time in linear transport.

In alternative embodiments, conventional linear transport geometry also could achieve monolayer-scale layering. It also could achieve X-Y lamination with the addition of a substrate rotation linkage at the end of each pass. Various ways of constructing planetary motion linkages have been developed and are in use, typically involving either gears, chains, or friction rollers to couple the substrate (planet) rotation to the plate (orbit) rotation and thence to a rotating feedthrough in the vacuum wall, driven by an external motor. Separate planet and orbit drives may also be incorporated using a coaxial rotating feedthrough.

Figure 3:
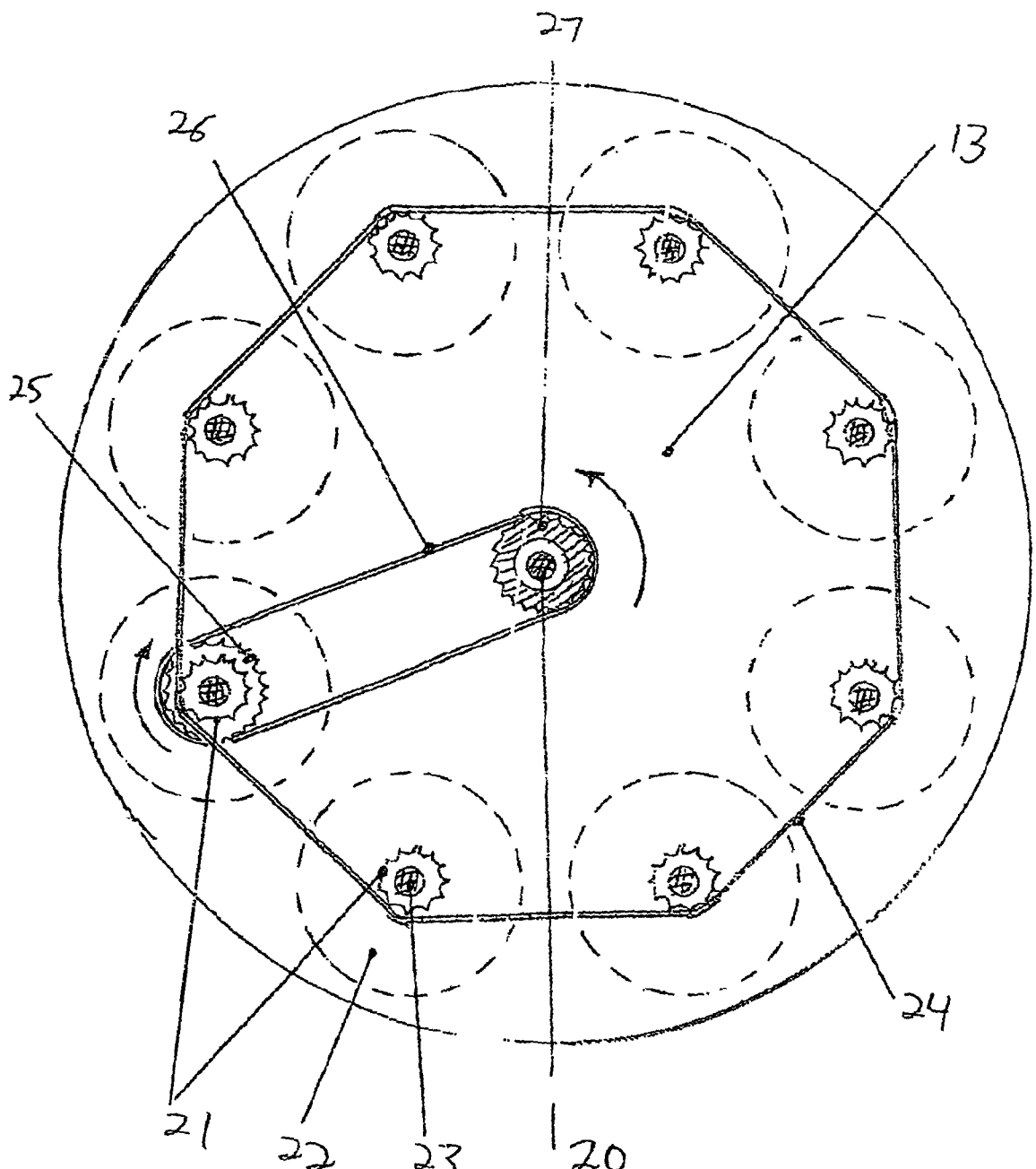
FIG. 3 is a schematic diagram that shows a plan view if a chain coupling arrangement for the planetary system shown in FIG. 1 according to the invention.

A new and simpler method of chain-coupling the orbit and planet drives is disclosed herein for use in connection with the invention. FIG. 3 is a schematic diagram that shows a plan view if a chain coupling arrangement for the planetary system shown in FIG. 1 according to the invention. In this approach, first a single rotating feedthrough drives the plate 13 so that all substrates on their platforms 22 rotate together. Finally, one of the substrate axles 23 has a second sprocket 25 linked by a second chain 26 to a stationary sprocket 27 of the same diameter at the center of the plate 13. This results in substrate rotation relative to the plate 13 at the same angular velocity but with opposite sign as ring rotation, with a minimum of moving parts and hardware and thus with maximum robustness at high speeds. The sprocket ratio on the second chain could be changed to provide non-unity ratios of planet and orbit angular velocity. However, with the arrangement of FIG. 3, the substrate does not rotate relative to the source of depositing material as it passes by the source, thus avoiding possible radial nonuniformity in deposition conditions on the substrate. An equivalent gear linkage could also be used.

EXAMPLE

Fixturing to practice the invention is installed in a conventional $10^{-7}$ Torr stainless-steel or aluminum high-vacuum chamber with elastomer seals and cryopumping, such as manufactured by Leybold and other vendors.

The system includes at least two rectangular magnetron sputter sources, such as those manufactured by Leybold, and an ion gun with a 6-inch diameter beam, such as the Kaufman-style guns manufactured by Commonwealth, arranged as described above. The cathodes are oriented 90 degrees to each other. The distance from magnetron target surface to wafer is 1".

The planetary linkage for wafer motion is connected so that the wafers remain in the same rotational orientation about their own normal axes relative to a fixed point as they orbit about the central axis of the chamber.

The plate rotating about the central axis carries 6" wafers on a 10-inch orbiting radius from the center of the plate, and the 14-inch long magnetrons and the ion gun are centered on the wafers. Fixturing is arranged so that the wafers see an even angular distribution and flux of depositing material across their surface.

Calibration Process

Calibration Step 1:

Film stress vs. pressure of an Ar sputtering gas is measured by sputter deposition at various fixed pressures onto thin wafers. The stress is then calculated in a conventional manner by means of the change in curvature of the wafer caused by the deposition. Deposition at the lowest pressure of typically 1 mTorr may be performed with varying fluxes of 200 to 1000 eV Ar ions to increase compressive stress.

Calibration Step 2:

Deposition of a multilayer structure is carried out using a progression from compressive to tensile stress along the positive-slope portion of the stress-pressure curve. Springs are patterned and lifted, and spring curvature radius calculated from lift height.

Typical Parameters

Typical parameters used for the deposition are as follows (ranges are shown in brackets):

MoCr alloy target, typ. 0–20 at. % Cr: power 2400 W (500–10,000), gas flow: Ar 80 sccm (50–500), pressure: 0.6 to 15 mT (0.2–50), rotation: 120 rpm (10–300).

Ion Gun: beam current from 50 to 500 mA, ion energy from 200 to 1000 eV.

For the first compressive layers, the ion gun and the magnetrons are operated simultaneously in some embodiments.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A method for depositing a film on substrates by sputter deposition comprising the steps of:
    providing at least one substrate mounted on a substrate holder affixed to a substantially circular carrier plate, wherein both the substrate and the carrier plate synchronously rotate about their respective normal axes;
    providing at least two elongated, substantially identical deposition sources (targets) that are angularly spaced to average out X-Y anisotropy in a plane parallel to the substrate, said sources comprising substantially the same materials and operated to provide substantially the same deposition characteristics, having a long dimension positioned parallel to a carrier plate radius, with their surfaces facing the substrate substantially coplanar, said long dimension being substantially larger than a substrate dimension, and having a perpendicular distance between substrate and deposition source surfaces;
    initiating a sputter deposition process by striking a plasma at sub-atmospheric gas pressure inside a deposition chamber as the carrier plate rotates about its normal axis along with the affixed substrate, which additionally undergoes a concomitant rotation about its own normal axis, as measured relative to the carrier plate, with equal and opposite angular velocity as that of the rotating carrier plate wherein orientation of the substrate relative to each deposition source remains constant as the carrier plate rotates; and
    depositing successive layers of thin films onto the substrate as it repeatedly traverses each of the deposition sources;
    wherein the resulting film, comprising a plurality of thin film layers, is formed with substantially uniform thickness and isotropic properties.

2. The method of claim 1, wherein said at least two deposition sources are located at any of about 45°, about 90°, or about 120° angles relative to each other and wherein said substrates are rotated by approximately about 45°, about 90°, or about 120° angles, respectively, as said substrates pass by each of said at least one deposition sources.

3. The method of claim 1, wherein the deposition rate is within the range of about 1 to about 60 μm/hr; and wherein preferred plate rotation is within the range of about 6 rpm to about 600.

4. The method of claim 1, wherein isotropic properties comprise of stress.

5. The method of claim 1, wherein said thin film layer thickness is about 1–10 Angstroms per carrier plate rotation.

6. The method of claim 1, wherein ion compression is obtained by rf or dc bias of a fixed substrate.

7. The method of claim 1, wherein a plurality of thin layers of films are deposited, wherein stresses in adjacent layers are different, resulting in the formation of a film with a stress gradient having a pre-determined value in a direction normal to the film surface.

8. The method of claim 7, wherein stresses in the thin layers are varied from a compressive at the bottom to tensile at the surface.

9. An apparatus for depositing a film on substrates by sputter deposition comprising:
    at least one substrate mounted on a substrate holder affixed to a substantially circular carrier plate, wherein both the substrate and the carrier plate synchronously rotate about their respective normal axes;
    at least two elongated, substantially identical deposition sources (targets) that are angularly spaced to average out x-y anisotropy in a plane parallel to the substrate, said sources comprising substantially the same materials and operated to provide substantially the same deposition characteristics having a long dimension positioned parallel to a carrier plate radius, with their surfaces facing the substrate substantially coplanar, said long dimension being substantially larger than a substrate dimension, and having a perpendicular distance between substrate and deposition source surfaces;
    means for initiating a sputter deposition process by striking a plasma at sub-atmospheric gas pressure inside a deposition chamber as the carrier plate rotates about its normal axis along with the affixed substrate, which additionally undergoes a concomitant rotation about its own normal axis, as measured relative to the carrier plate, with equal and opposite angular velocity as that of the rotating carrier plate, wherein orientation of the at least one substrate relative to each of the deposition sources remains constant as the carrier plate rotates; and
    wherein successive layers of thin films are deposited onto the substrate as it repeatedly traverses each of the deposition sources;

wherein the resulting film, comprising a plurality of thin film layers, is formed with substantially uniform thickness and isotropic properties.

10. The method of claim 3, wherein the deposition rate is from about 1 to about 4 µm/hr and the plate rotation is within the range of about 10 rpm to about 200 rpm.

11. The method of claim 1, wherein said resulting film has a predetermined isotropic level of stress selected from the group consisting of compressive stress, neutral stress, and tensile stress.

12. The apparatus of claim 9, wherein isotropic properties comprise of stress.

13. The apparatus of claim 9, wherein said resulting film has a predetermined isotropic level of stress selected from the group consisting of compressive stress, neutral stress, and tensile stress.

14. The apparatus of claim 9, wherein said at least two deposition sources are located at any of about 45°, about 90°, or about 120° angles relative to each other and wherein a drive mechanism is provided to rotate said substrates by approximately about 45°, about 90°, or about 120° angles, respectively, as said substrates pass by each of said at least one deposition sources.

15. The apparatus of claim 9, further comprising:
a drive mechanism comprising a peripheral chain arranged around a ring of substrates, and a chain extending from one substrate to a fixed central sprocket, to impart high speed, planetary motion to said substrate.

16. The apparatus of claim 9, wherein said at least one deposition source comprises a rectangular target; and
wherein said substrates are located centrally when passing said target.

17. The apparatus of claim 9, wherein the ratio of a perpendicular distance between substrate and deposition source surfaces to the distance between the edge of said long dimension and the nearest substrate edge is about 1:4 or smaller.

18. The apparatus of claim 9, further comprising:
one or more magnetron targets that are longer, when compared to a substrate diameter, than is needed for uniform film thickness;
wherein uniform film stress along a long axis of said target is achieved.

* * * * *